(12) United States Patent
Feng et al.

(10) Patent No.: US 11,380,251 B2
(45) Date of Patent: Jul. 5, 2022

(54) LED DISPLAY SCREEN CALIBRATION METHOD AND RELATED APPARATUS

(71) Applicant: SHENZHEN ABSEN OPTOELECTRONIC CO., LTD., Guangdong (CN)

(72) Inventors: Shuanglei Feng, Guangdong (CN); Tao Wu, Guangdong (CN); Chongkang Ding, Guangdong (CN); Daocan Xiao, Guangdong (CN)

(73) Assignee: SHENZHEN ABSEN OPTOELECTRONIC CO., LTD., Shenzhen (CN)

( * ) Notice: Subject to any disclaimer, the term of this patent is extended or adjusted under 35 U.S.C. 154(b) by 0 days.

(21) Appl. No.: 17/365,375

(22) Filed: Jul. 1, 2021

(65) Prior Publication Data

US 2022/0036811 A1 Feb. 3, 2022

Related U.S. Application Data

(63) Continuation of application No. PCT/CN2017/078684, filed on Mar. 2, 2021.

(30) Foreign Application Priority Data

Jul. 30, 2020 (CN) .......................... 202010751971.5

(51) Int. Cl.
*G09G 3/32* (2016.01)
*G01R 31/28* (2006.01)

(52) U.S. Cl.
CPC ........... *G09G 3/32* (2013.01); *G01R 31/2825* (2013.01); *G09G 2320/0233* (2013.01);
(Continued)

(58) Field of Classification Search
CPC .......... G09G 3/32–3291; G09G 2300/02–026; G09G 2320/0233–0242;
(Continued)

(56) References Cited

U.S. PATENT DOCUMENTS

| | | | | | |
|---|---|---|---|---|---|
| 5,684,503 | A | * | 11/1997 | Nomura | ............... G09G 3/3692 345/97 |
| 2017/0236490 | A1 | * | 8/2017 | Cheon | ...................... G09G 5/10 345/691 |
| 2018/0082633 | A1 | * | 3/2018 | Tan | .......................... G09G 3/20 |

FOREIGN PATENT DOCUMENTS

| | | |
|---|---|---|
| CN | 106652898 A | 5/2017 |
| CN | 206628249 U | 11/2017 |

(Continued)

OTHER PUBLICATIONS

International Search Report issued in corresponding International Application No. PCT/CN2021/078684, dated May 26, 2021, pp. 1-5.

*Primary Examiner* — Nathan Danielsen
(74) *Attorney, Agent, or Firm* — Hauptman Ham, LLP (57) ABSTRACT

Embodiments of this application provide a light emitting diode (LED) display screen calibration method and a related apparatus. The method includes: calculating a point-by-point thermal compensation calibration coefficient based on a thermal compensation calibration coefficient and a point-by-point calibration coefficient of an LED display screen box; and calibrating the LED display screen box based on the point-by-point thermal compensation calibration coefficient.

20 Claims, 4 Drawing Sheets

(52) U.S. Cl.
CPC . *G09G 2320/041* (2013.01); *G09G 2320/043* (2013.01); *G09G 2320/0666* (2013.01); *G09G 2320/0693* (2013.01); *G09G 2360/145* (2013.01)

(58) Field of Classification Search
CPC ..... G09G 2320/0252; G09G 2320/029; G09G 2320/0295–048; G09G 2320/0666; G09G 2320/0686; G09G 2320/0693; G09G 2360/14; G09G 2360/145–148; G01R 31/2825
See application file for complete search history.

(56) References Cited

FOREIGN PATENT DOCUMENTS

| | | | |
|---|---|---|---|
| CN | 109671388 | A | 4/2019 |
| CN | 110689841 | A | 1/2020 |
| KR | 20190078316 | A | 7/2019 |

* cited by examiner

LED DISPLAY SCREEN CALIBRATION METHOD AND RELATED APPARATUS

CROSS-REFERENCE TO RELATED APPLICATION(S)

This application is a continuation of International Application No. PCT/CN2021/078684, filed on Mar. 2, 2021, which claims priority to Chinese Patent Application No. 202010751971.5, filed on Jul. 30, 2020, the disclosures of which are hereby incorporated by reference in their entireties.

TECHNICAL FIELD

This application relates to the field of display technologies, and in particular, to a light emitting diode (light emitting diode, LED) display screen calibration method and a related apparatus.

BACKGROUND

An LED display screen is a flat-panel display composed of small LED module panels, and is configured to display types of information such as texts, images, and videos. The LED display screen may be widely applied to a plurality of scenarios such as traffic signal lights, art shows, and press conferences. Therefore, people have increasing requirements on display quality of the LED display screen. Light luminance and chrominance of the LED display screen are two important metrics of the display quality. The light luminance of the LED display screen decreases as a temperature increases, and LEDs with different light luminance are subject to different impact of the temperature. Therefore, poor consistency in display luminance and chrominance due to an uneven heat distribution on the LED display screen becomes a big problem in the technical field.

Currently, people usually cope with the poor consistency in display luminance and chrominance by using a point-by-point thermal compensation calibration method. During point-by-point thermal compensation calibration, thermal compensation calibration is first performed on the LED display screen. After the LED display screen reaches a heat balance state, point-by-point calibration is performed on the LED display screen. However, the foregoing point-by-point thermal compensation calibration method takes a very long time, and calibration efficiency is low. In addition, when a module location of an LED display screen changes, the thermal compensation calibration cannot achieve an expected effect.

SUMMARY

According to a first aspect, an embodiment of this application discloses a light emitting diode (LED) display screen calibration method, including:

calculating a point-by-point thermal compensation calibration coefficient based on a thermal compensation calibration coefficient and a point-by-point calibration coefficient of an LED display screen box, where the thermal compensation calibration coefficient is related to a mechanical structure of the LED display screen box and is irrelevant to a module location of the LED display screen box, the point-by-point calibration coefficient is related to the module location of the LED display screen box, and the point-by-point thermal compensation calibration coefficient is related to the mechanical structure of the LED display screen box and is irrelevant to the module location of the LED display screen box; and calibrating the LED display screen box based on the point-by-point thermal compensation calibration coefficient.

According to a second aspect, an embodiment of this application discloses an electronic device for LED display screen calibration. The electronic device includes a memory and a processor. The memory is coupled to the processor and stores program instructions thereon which, when executed by the processor, cause the processor to execute the method of the first aspect.

According to a third aspect, an embodiment of this application discloses a non-transitory computer-readable storage medium. The non-transitory computer-readable storage medium stores a computer program which, when executed by a processor, causes the processor to execute the method of the first aspect.

BRIEF DESCRIPTION OF DRAWINGS

To describe the technical solutions in the embodiments of this application or the background more clearly, the following briefly describes the accompanying drawings required in the embodiments of this application or the background.

DESCRIPTION OF EMBODIMENTS

To make the objectives, technical solutions, and advantages of this application clearer, the following further describes this application with reference to the accompanying drawings.

In the specification, claims, and accompanying drawings of this application, the terms "first", "second", and the like are merely intended to distinguish between different objects but do not indicate a particular order. In addition, the terms "comprise", "include", and any variants thereof are intended to cover a non-exclusive inclusion. For example, a process, a method, a system, a product, a device, or the like that includes a series of steps or units is not limited to the listed steps or units, but optionally further includes steps or units that are not listed, or optionally further includes other steps or units inherent to the process, the method, the product, the device, or the like.

The "embodiment" mentioned in this specification means that a specific feature, structure, or characteristic described with reference to the embodiment may be included in at least one embodiment of this application. The phrase appearing in various locations in this specification does not necessarily mean a same embodiment, and is neither an independent or alternative embodiment mutually exclusive with other embodiments. It can be explicitly and implicitly understood by a person skilled in the art that the embodiments described in this specification may be combined with other embodiments.

In this application, "at least one" means one or more, "plurality" means two or more, "at least two" means two, three, or more, and "and/or" describes an association relationship for describing associated objects and represents that three relationships may exist. For example, "A and/or B" may represent the following three cases: Only A exists, only B exists, and both A and B exist. A and B may be singular or plural. The character "I" generally indicates an "or" relationship between the associated objects. "At least one of the following" or a similar expression thereof indicates any combination of the following. For example, at least one of a, b, or c may indicate a, b, c, "a and b", "a and c", "b and c", or "a, b, and c".

Hereinafter, embodiments of this application will be described in detail.

Embodiments of this application disclose a light emitting diode (LED) display screen calibration method and a related apparatus. A thermal compensation calibration coefficient and a point-by-point calibration coefficient are separated and calibrated separately, thereby resolving a problem that a thermal compensation calibration cannot achieve an expected effect because a module location of an LED display screen changes. In addition, the separate thermal compensation calibration coefficient needs to be collected only once for the LED display screen box of a same structure and printed circuit board (printed circuit board, PCB) layout, thereby greatly improving calibration efficiency.

According to a first aspect, an embodiment of this application discloses an LED display screen calibration method, including:

calculating a point-by-point thermal compensation calibration coefficient based on a thermal compensation calibration coefficient and a point-by-point calibration coefficient of an LED display screen box, where the thermal compensation calibration coefficient is related to a mechanical structure of the LED display screen box and is irrelevant to a module location of the LED display screen box, the point-by-point calibration coefficient is related to the module location of the LED display screen box, and the point-by-point thermal compensation calibration coefficient is related to the mechanical structure of the LED display screen box and is irrelevant to the module location of the LED display screen box; and calibrating the LED display screen box based on the point-by-point thermal compensation calibration coefficient.

In this embodiment of this application, a thermal compensation calibration coefficient used in an original calibration method is included in a point-by-point calibration coefficient, and the point-by-point calibration coefficient is related to the module location of the LED display screen box. Therefore, the thermal compensation calibration coefficient is also related to the module location of the LED display screen box. To be specific, when the module location of the LED display screen box changes, the thermal compensation calibration coefficient is affected by the change of the location of the module, and therefore a thermal compensation calibration cannot achieve an expected effect. In this embodiment of this application, an original point-by-point calibration performed after a heat balance is reached is divided into two parts: a point-by-point calibration and a thermal compensation calibration, which are separately performed, and two calibration coefficients are saved, thereby resolving a problem that the thermal compensation calibration cannot achieve an expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

In a possible implementation of the first aspect, the calculating a point-by-point thermal compensation calibration coefficient based on a thermal compensation calibration coefficient and a point-by-point calibration coefficient of an LED display screen box includes:

multiplying the thermal compensation calibration coefficient by the point-by-point calibration coefficient to obtain the point-by-point thermal compensation calibration coefficient.

In this embodiment of this application, the thermal compensation calibration and the point-by-point calibration are performed as two different parts, and the coefficients of the two calibrations are separated. The point-by-point thermal compensation calibration coefficient obtained by calculating a product of the thermal compensation calibration coefficient and the point-by-point calibration coefficient is related only to the mechanical structure of the LED display screen box and is irrelevant to the module location of the LED display screen box, so that an effect of separate calibrations can be achieved, and the thermal compensation calibration is still effective even if the module location of the LED display screen box changes.

In a possible implementation of the first aspect, the calibrating the LED display screen box based on the point-by-point thermal compensation calibration coefficient includes:

calibrating the LED display screen box based on the point-by-point thermal compensation calibration coefficient when the module location of the LED display screen box changes.

In this embodiment of this application, the calculated point-by-point thermal compensation calibration coefficient is related only to the mechanical structure of the LED display screen box and is irrelevant to the module location of the LED display screen box, so that the thermal compensation calibration is still effective even if the module location of the LED display screen box changes.

In a possible implementation of the first aspect, the calibrating the LED display screen box based on the point-by-point thermal compensation calibration coefficient includes:

if a temperature of the LED display screen box is less than a first threshold, calibrating the LED display screen box by using a first point-by-point thermal compensation calibration coefficient;

if a temperature of the LED display screen box is greater than a second threshold, calibrating the LED display screen box by using a second point-by-point thermal compensation calibration coefficient; or if a temperature of the LED display screen box is not less than the first threshold and not greater than the second threshold, calibrating the LED display screen box by using a third point-by-point thermal compensation calibration coefficient, where the first point-by-point thermal compensation calibration coefficient, the second point-by-point thermal compensation calibration coefficient, and the third point-by-point thermal compensation calibration coefficient are different values of the point-by-point thermal compensation calibration coefficient.

In this embodiment of this application, the LED display screen box is calibrated by using different point-by-point thermal compensation calibration coefficients based on different temperatures of the LED display screen box. The thermal compensation calibration coefficient of the LED display screen box varies at different temperatures, and product results of different thermal compensation calibration coefficients and point-by-point calibration coefficients also correspond to a plurality of different point-by-point thermal compensation calibration coefficients. Therefore, temperature monitoring of the LED display screen box may be associated with the point-by-point thermal compensation calibration coefficient. To be specific, several temperature thresholds, such as the first threshold and the second threshold, may be set. When it is detected that the temperature of the LED display screen box is less than the first threshold, the LED display screen box is calibrated by using the first point-by-point thermal compensation calibration coefficient. When it is detected that the temperature of the LED display screen box is greater than the second threshold, the LED display screen box is calibrated by using the second point-by-point thermal compensation calibration coefficient. When it is detected that the temperature of the LED display screen box is not less than the first threshold and not greater than the second threshold, the LED display screen box is calibrated by using the third point-by-point thermal compensation calibration coefficient. Therefore, an automatic point-by-point thermal compensation calibration function of the LED display screen box can be implemented by using the foregoing calibration method.

In a possible implementation of the first aspect, before the calculating a point-by-point thermal compensation calibration coefficient, the method further includes:

performing thermal-shield calibration on the LED display screen box to obtain a sample box, where the sample box is the LED display screen box that has undergone the thermal-shield calibration;

performing white-light aging treatment on the sample box until the sample box reaches a heat balance state, where the heat balance state means that a heat distribution and a maximum temperature of the sample box no longer change;

collecting a red luminance value matrix of the sample box in the heat balance state; and calculating a thermal compensation calibration coefficient matrix of the LED display screen box based on the red luminance value matrix, where the thermal compensation calibration coefficient matrix includes the thermal compensation calibration coefficient.

In this embodiment of this application, a method for obtaining the thermal compensation calibration coefficient is provided. Thermal-shield calibration is performed on the LED display screen box, and then white-light aging treatment is performed, until the heat distribution and the maximum temperature of the LED display screen box no longer change. Then the red luminance value matrix of the LED display screen box is collected, and the thermal compensation calibration coefficient is calculated based on the collected red luminance value matrix. The thermal compensation calibration coefficient obtained by using this method is related to the mechanical structure of the LED display screen box and is irrelevant to the module location of the LED display screen box.

In a possible implementation of the first aspect, the calculating a thermal compensation calibration coefficient matrix of the LED display screen box based on the red luminance value matrix includes:

dividing a maximum value in the red luminance value matrix by the red luminance value matrix to obtain the thermal compensation calibration coefficient matrix of the LED display screen box.

In this embodiment of this application, a method for calculating the thermal compensation calibration coefficient matrix is provided. The maximum value in the collected red luminance value matrix of the sample box is divided by the red luminance value matrix to obtain the thermal compensation calibration coefficient matrix. The thermal compensation calibration coefficient matrix includes thermal compensation calibration coefficients of the LED display screen box at different temperatures.

In a possible implementation of the first aspect, before the calculating a point-by-point thermal compensation calibration coefficient, the method further includes:

collecting luminance and chrominance data of the LED display screen box; and calculating a point-by-point calibration coefficient matrix of the LED display screen box based on the luminance and chrominance data of the LED display screen box, where the point-by-point calibration coefficient matrix includes the point-by-point calibration coefficient.

In this embodiment of this application, a method for obtaining the point-by-point calibration coefficient is provided. The luminance and chrominance data of the LED display screen box is collected, and the point-by-point calibration coefficient matrix is calculated based on the luminance and chrominance data. The point-by-point calibration coefficient matrix includes the point-by-point calibration coefficient. The point-by-point calibration coefficient is related to the module location of the LED display screen box.

In a possible implementation of the first aspect, the point-by-point calibration coefficient and the thermal compensation calibration coefficient are stored in different locations.

In this embodiment of this application, the point-by-point calibration coefficient and the thermal compensation calibration coefficient are stored separately, so that the thermal compensation calibration and the point-by-point calibration are performed as two different parts, thereby resolving a problem that the thermal compensation calibration cannot achieve an expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

According to a second aspect, an embodiment of this application discloses an LED display screen calibration apparatus, including:

a calculation unit, configured to calculate a point-by-point thermal compensation calibration coefficient based on a thermal compensation calibration coefficient and a point-by-point calibration coefficient of an LED display screen box, where the thermal compensation calibration coefficient is related to a mechanical structure of the LED display screen box and is irrelevant to a module location of the LED display screen box, the point-by-point calibration coefficient is related to the module location of the LED display screen box, and the point-by-point thermal compensation calibration coefficient is related to the mechanical structure of the LED display screen box and is irrelevant to the module location of the LED display screen box; and a calibration unit, configured to calibrate the LED display screen box based on the point-by-point thermal compensation calibration coefficient.

In this embodiment of this application, a thermal compensation calibration coefficient used in an original calibration method is included in a point-by-point calibration coefficient, and the point-by-point calibration coefficient is related to the module location of the LED display screen box. Therefore, the thermal compensation calibration coefficient is also related to the module location of the LED display screen box. To be specific, when the module location of the LED display screen box changes, the thermal compensation calibration coefficient is affected by the change of the location of the module, and therefore a thermal compensation calibration cannot achieve an expected effect. In this embodiment of this application, an original point-by-point calibration performed after a heat balance is reached is divided into two parts: a point-by-point calibration and a thermal compensation calibration, which are separately performed, and two calibration coefficients are saved, thereby resolving a problem that the thermal compensation calibration cannot achieve an expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

In a possible implementation of the second aspect, the calculation unit is specifically configured to multiply the thermal compensation calibration coefficient by the point-by-point calibration coefficient to obtain the point-by-point thermal compensation calibration coefficient.

In this embodiment of this application, the thermal compensation calibration and the point-by-point calibration are performed as two different parts, and the coefficients of the two calibrations are separated. The point-by-point thermal compensation calibration coefficient obtained by calculating a product of the thermal compensation calibration coefficient and the point-by-point calibration coefficient is related only to the mechanical structure of the LED display screen box and is irrelevant to the module location of the LED display screen box, so that an effect of separate calibrations can be achieved, and the thermal compensation calibration is still effective even if the module location of the LED display screen box changes.

In a possible implementation of the second aspect, the calibration unit is specifically configured to calibrate the LED display screen box based on the point-by-point thermal compensation calibration coefficient when the module location of the LED display screen box changes.

In this embodiment of this application, the calculated point-by-point thermal compensation calibration coefficient is related only to the mechanical structure of the LED display screen box and is irrelevant to the module location of the LED display screen box, so that the thermal compensation calibration is still effective even if the module location of the LED display screen box changes.

In a possible implementation of the second aspect, the calibration unit is specifically further configured to: if a temperature of the LED display screen box is less than a first threshold, calibrate the LED display screen box by using a first point-by-point thermal compensation calibration coefficient; if a temperature of the LED display screen box is greater than a second threshold, calibrate the LED display screen box by using a second point-by-point thermal compensation calibration coefficient; or if a temperature of the LED display screen box is not less than the first threshold and not greater than the second threshold, calibrate the LED display screen box by using a third point-by-point thermal compensation calibration coefficient, where the first point-by-point thermal compensation calibration coefficient, the second point-by-point thermal compensation calibration coefficient, and the third point-by-point thermal compensation calibration coefficient are different values of the point-by-point thermal compensation calibration coefficient.

In this embodiment of this application, the LED display screen box is calibrated by using different point-by-point thermal compensation calibration coefficients based on different temperatures of the LED display screen box. The thermal compensation calibration coefficient of the LED display screen box varies at different temperatures, and product results of different thermal compensation calibration coefficients and point-by-point calibration coefficients also correspond to a plurality of different point-by-point thermal compensation calibration coefficients. Therefore, temperature monitoring of the LED display screen box may be associated with the point-by-point thermal compensation calibration coefficient. To be specific, several temperature thresholds, such as the first threshold and the second threshold, may be set. When it is detected that the temperature of the LED display screen box is less than the first threshold, the LED display screen box is calibrated by using the first point-by-point thermal compensation calibration coefficient. When it is detected that the temperature of the LED display screen box is greater than the second threshold, the LED display screen box is calibrated by using the second point-by-point thermal compensation calibration coefficient. When it is detected that the temperature of the LED display screen box is not less than the first threshold and not greater than the second threshold, the LED display screen box is calibrated by using the third point-by-point thermal compensation calibration coefficient. Therefore, an automatic point-by-point thermal compensation calibration function of the LED display screen box can be implemented by using the foregoing calibration method.

In a possible implementation of the second aspect, the calibration unit is further configured to perform thermal-shield calibration on the LED display screen box to obtain a sample box, where the sample box is the LED display screen box that has undergone the thermal-shield calibration. The apparatus further includes:

an aging unit, configured to perform white-light aging treatment on the sample box until the sample box reaches a heat balance state, where the heat balance state means that a heat distribution and a maximum temperature of the sample box no longer change; and a collection unit, configured to collect a red luminance value matrix of the sample box in the heat balance state, where the calculation unit is further configured to calculate a thermal compensation calibration coefficient matrix of the LED display screen box based on the red luminance value matrix, where the thermal compensation calibration coefficient matrix includes the thermal compensation calibration coefficient.

In this embodiment of this application, a method for obtaining the thermal compensation calibration coefficient is provided. Thermal-shield calibration is performed on the LED display screen box, and then white-light aging treatment is performed, until the heat distribution and the maximum temperature of the LED display screen box no longer change. Then the red luminance value matrix of the LED display screen box is collected, and the thermal compensation calibration coefficient is calculated based on the collected red luminance value matrix. The thermal compensation calibration coefficient obtained by using this method is related to the mechanical structure of the LED display screen box and is irrelevant to the module location of the LED display screen box.

In a possible implementation of the second aspect, the calculation unit is further configured to divide a maximum value in the red luminance value matrix by the red luminance value matrix to obtain the thermal compensation calibration coefficient matrix of the LED display screen box.

In this embodiment of this application, a method for calculating the thermal compensation calibration coefficient matrix is provided. The maximum value in the collected red luminance value matrix of the sample box is divided by the red luminance value matrix to obtain the thermal compensation calibration coefficient matrix. The thermal compensation calibration coefficient matrix includes thermal compensation calibration coefficients of the LED display screen box at different temperatures.

In a possible implementation of the second aspect, the collection unit is further configured to collect luminance and chrominance data of the LED display screen box; and the calculation unit is further configured to calculate a point-by-point calibration coefficient matrix of the LED display screen box based on the luminance and chrominance data of the LED display screen box, where the point-by-point calibration coefficient matrix includes the point-by-point calibration coefficient.

In this embodiment of this application, a method for obtaining the point-by-point calibration coefficient is provided. The luminance and chrominance data of the LED display screen box is collected, and the point-by-point calibration coefficient matrix is calculated based on the luminance and chrominance data. The point-by-point calibration coefficient matrix includes the point-by-point calibration coefficient. The point-by-point calibration coefficient is related to the module location of the LED display screen box.

In a possible implementation of the second aspect, the point-by-point calibration coefficient and the thermal compensation calibration coefficient are stored in different locations.

In this embodiment of this application, the point-by-point calibration coefficient and the thermal compensation calibration coefficient are stored separately, so that the thermal compensation calibration and the point-by-point calibration are performed as two different parts, thereby resolving a problem that the thermal compensation calibration cannot achieve an expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

According to a third aspect, an embodiment of this application discloses an electronic device for LED display screen calibration. The electronic device includes a memory and a processor. The memory is coupled to the processor and stores program instructions thereon which, when executed by the processor, cause the processor to execute the method according to any one of the first aspect or the possible implementations of the first aspect.

According to a fourth aspect, an embodiment of this application discloses a non-transitory computer-readable storage medium. The non-transitory computer-readable storage medium stores a computer program which, when executed by a processor, causes the processor to execute the method according to any one of the first aspect or the possible implementations of the first aspect.

In the embodiments of this application, the thermal compensation calibration coefficient that needs to be used in the thermal compensation calibration is related to the mechanical structure and the module location of the LED display screen box, and the point-by-point calibration coefficient that needs to be used in the point-by-point calibration is related to the module location of the LED display screen box. Therefore, when the module location of the LED display screen box changes, the thermal compensation calibration coefficient is affected, and the thermal compensation calibration cannot achieve the expected effect. However, the original point-by-point calibration performed after the heat balance is reached is divided into two parts: the point-by-point calibration and the thermal compensation calibration, which are separately performed, and two calibration coefficients are saved, thereby resolving the problem that the thermal compensation calibration cannot achieve the expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

The embodiments of this application provide an LED display screen calibration method. To describe the solutions of this application more clearly, the following first describes some knowledge related to calibration of an LED display screen box.

LED display screen box: In short, the LED display screen box is a screen body composed of several display units (unit display panels or unit display screen boxes) that can be combined and spliced. To adapt to different environments, a set of appropriate controller (a main control board or a control system) is further added. Therefore, display boards (or unit boxes) of a plurality of specifications may be combined with controllers of different control technologies to form many types of LED display screens, to meet different display requirements. An area of the LED display screen box cannot be too large, and one box usually accommodates one display screen. The LED display screen box is mainly mounted through hoisting. Display screens on two sides may share one LED control card. The control card is a partition control card. The two sides usually have a same area and display same content. Software content only needs to be divided into two identical parts. The LED display screen box is applied to various fields such as stages, conferences, and outdoors. Because a template weight is very heavy, it is inconvenient to use the LED display screen box, and costs are also high. With improvement of technologies, the LED display screen box is modified to become increasingly simple. The LED display screen box dissipates heat fast and has high heat dissipation performance, which can effectively protect a module circuit. The LED display screen box has an anti-interference function and a unique anti-electromagnetic wave interference function. The LED display screen box has high strength, and the box succeeds in a 300 kg tension test.

LED display screen module: The LED display screen module is one of main components that constitute a finished LED display screen. The LED display screen module is mainly composed of an LED light, a PCB circuit board, a driving IC, a resistor, a capacitor, and a plastic kit.

LED display screen modules may be classified into the following based on colors: a single-color module, for example, a pure-red, pure-green, pure-blue, pure-yellow, or pure-white module; a dual-color module, for example, a red-green or red-blue dual-color module; and an all-color module, which is mainly a product obtained by applying three primary colors of red, green, and blue to an LED module. LED display screen modules may be classified into three types of modules based on their different use space: indoor, semi-outdoor, and outdoor modules. Alternatively, LED display screen modules may be classified into an in-line LED display screen module, an indoor dot-matrix LED display screen module, and a surface-mount LED display screen module based on different LED packaging devices used.

Point-by-point calibration: Point-by-point calibration is a technology used to improve luminance uniformity and color uniformity and color fidelity of an LED display screen. To be specific, luminance (and chrominance) data of each pixel (or each primary color sub-pixel) region on the LED display screen is collected; a calibration coefficient for each primary color sub-pixel or a calibration coefficient matrix for each pixel is provided, and is fed back to a control system of the display screen; and the control system applies the calibration coefficient to implement differential driving for each pixel (or each primary color sub-pixel), so that an image of the LED display screen is pure and delicate, and a color is truly restored.

The following describes the embodiments of this application with reference to the accompanying drawings in the embodiments of this application.

Figure 1:
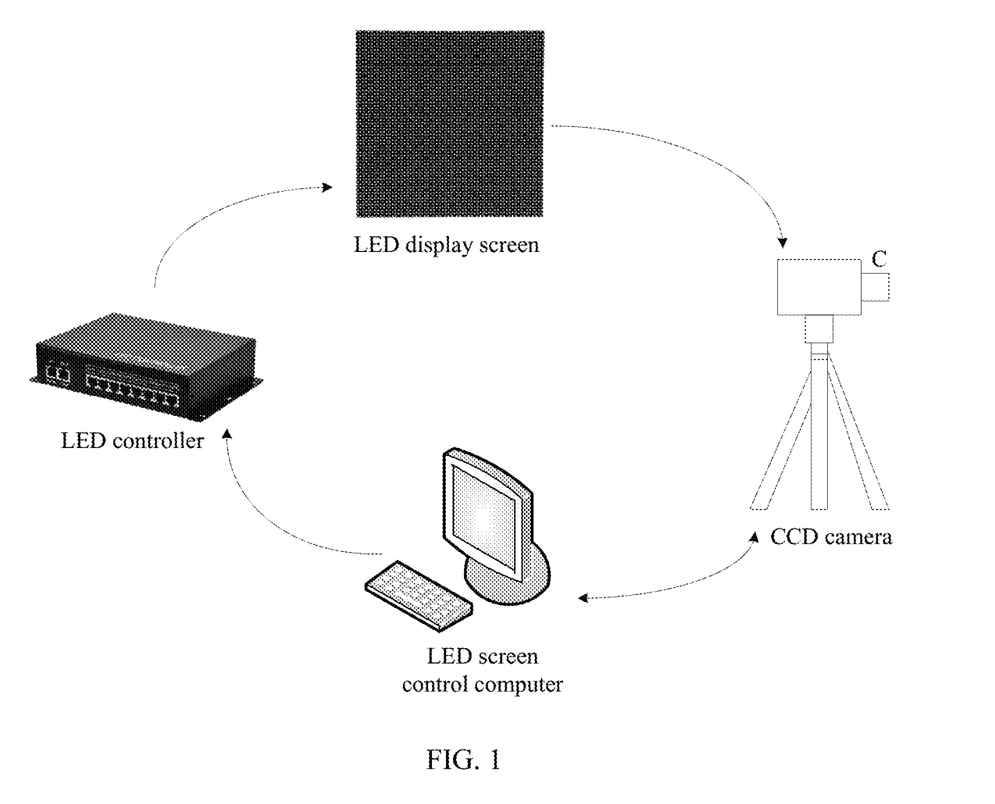
FIG. 1 is a schematic architectural diagram of LED display screen box calibration according to an embodiment of this application.

FIG. 1 is a schematic architectural diagram of LED display screen box calibration according to an embodiment of this application. As shown in FIG. 1, the architectural diagram includes an LED display screen box, an LED controller, a control computer, and a camera. The camera is configured to collect luminance and chrominance data of the LED box, and transmit the collected luminance and chrominance data to the control computer. The control computer calculates a point-by-point calibration coefficient. The control computer is connected to the LED controller through a network, and indicates the LED controller to perform point-by-point luminance and chrominance calibration on the LED display screen box by using the calculated point-by-point calibration coefficient. The point-by-point luminance and chrominance calibration addresses a chrominance deviation by changing color coordinates of the RGB colors according to a principle of RGB color matching. During the point-by-point luminance and chrominance calibration, color coordinates of the RGB colors after calibration should be properly selected to avoid color distortion. The point-by-point luminance and chrominance calibration adjusts luminance and color uniformity of each LED light. The foregoing architectural diagram of calibration is applicable to calibration managed by a factory in a normalized and standardized manner. The box can be spliced freely. Edges of the box are automatically calibrated, with a same and smallest calibration angle. Calibration efficiency is high, and calibration costs are low.

A calibration effect for the LED display screen box may be mainly determined based on display quality of an LED display screen. Light luminance and chrominance of the LED display screen are two important metrics of the display quality. The light luminance of the LED display screen decreases as a temperature increases, and LEDs with different light luminance are subject to different impact of the temperature. Therefore, how to cope with poor consistency in display luminance and chrominance due to an uneven heat distribution on the LED display screen by using an LED display screen box calibration method becomes a main research direction in the technical field. Currently, people usually cope with the poor consistency in display luminance and chrominance by using a point-by-point thermal compensation calibration method. During point-by-point thermal compensation calibration, thermal compensation calibration is first performed on the LED display screen. After the LED display screen reaches a heat balance state, point-by-point calibration is performed on the LED display screen. However, the foregoing point-by-point thermal compensation calibration method takes a very long time, and calibration efficiency is low. In addition, when a location of an LED display screen module changes, a thermal compensation calibration coefficient changes as the module location of the LED display screen box changes, and the thermal compensation calibration cannot achieve an expected effect.

Figure 2:
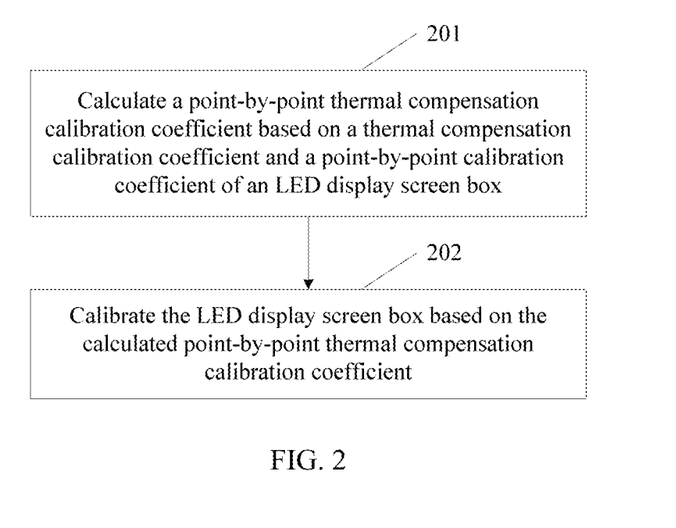
FIG. 2 is a schematic flowchart of an LED display screen calibration method according to an embodiment of this application.

FIG. 2 is a schematic flowchart of an LED display screen calibration method according to an embodiment of this application. The method includes but is not limited to the following steps.

Step 201: Calculate a point-by-point thermal compensation calibration coefficient based on a thermal compensation calibration coefficient and a point-by-point calibration coefficient of an LED display screen box.

The point-by-point thermal compensation calibration coefficient is calculated based on the thermal compensation calibration coefficient and the point-by-point calibration coefficient of the LED display screen box. The thermal compensation calibration coefficient is related to a mechanical structure of the LED display screen box and is irrelevant to a module location of the LED display screen box. To be specific, when the mechanical structure of the LED display screen box changes, the thermal compensation calibration coefficient of the LED display screen box also changes accordingly, and the thermal compensation calibration coefficient of the LED display screen box does not change as the location of the module changes. The point-by-point calibration coefficient is related to the module location of the LED display screen box. To be specific, when the module location of the LED display screen box changes, the point-by-point calibration coefficient of the LED display screen box also changes accordingly. The point-by-point thermal compensation calibration coefficient is related to the mechanical structure of the LED display screen box and is irrelevant to the module location of the LED display screen box. To be specific, when the mechanical structure of the LED display screen box changes, the point-by-point thermal compensation calibration coefficient of the LED display screen box also changes accordingly, but the point-by-point thermal compensation calibration coefficient does not change as the module location of the LED display screen box changes. It can be learned that, in this embodiment, the LED display screen box is calibrated by using the point-by-point thermal compensation calibration coefficient, so that the point-by-point thermal compensation calibration can still achieve an expected effect when the module location of the LED display screen box changes. In this embodiment, an original point-by-point calibration performed after a heat balance is reached is divided into two parts: a point-by-point calibration and a thermal compensation calibration, which are separately performed, and two calibration coefficients are saved. In addition, the separate thermal compensation calibration coefficient needs to be collected only once for the LED display screen box of a same structure and PCB layout, thereby greatly improving calibration efficiency.

Specifically, there are many possible manners of calculating the point-by-point thermal compensation calibration coefficient. This embodiment provides a possible implementation. The thermal compensation calibration coefficient and the point-by-point calibration coefficient of the LED display screen box are multiplied, and a product result of the two coefficients is used as the point-by-point thermal compensation calibration coefficient. For the point-by-point calibration coefficient, luminance and chrominance data of the LED display screen box may be collected, and a point-by-point calibration coefficient matrix is calculated based on the luminance and chrominance data. The point-by-point calibration coefficient matrix includes a plurality of different point-by-point calibration coefficients. The point-by-point calibration coefficients are related to the module location of the LED display screen box. The thermal compensation calibration coefficient may be obtained in the following manner. First, thermal-shield point-by-point luminance and chrominance calibration is performed on the LED display screen box. Specifically, the thermal-shield calibration is to perform point-by-point luminance and chrominance calibration on the LED display screen box within one minute after the LED display screen box is lit at room temperature. The room temperature herein is approximately 25° C. The LED display screen box that has undergone the thermal-shield calibration is used as a sample box. Optionally, for the point-by-point calibration coefficient, luminance and chrominance data of the sample box may also be collected at this time to calculate a point-by-point calibration coefficient matrix. Then the LED sample box performs display at 100% luminance and is subject to white-light aging for approximately 30 minutes, so that the LED sample box reaches a heat balance state. The heat balance state means that a heat distribution of the LED sample box no longer changes and a maximum temperature no longer changes, which indicates that the LED sample box has reached the heat balance state. Then a red luminance value matrix of the sample box that has undergone the thermal-shield calibration and has reached the heat balance state is collected, and a result obtained by dividing a maximum value in the collected red luminance value matrix by the red luminance value matrix is used as a thermal compensation calibration coefficient matrix. The thermal compensation calibration coefficient matrix includes a plurality of thermal compensation calibration coefficients, and the thermal compensation calibration coefficients are related only to the mechanical structure of the LED display screen box, and do not change as the module location of the LED display screen box changes. The obtained point-by-point calibration coefficient and thermal compensation calibration coefficient are separately stored in different locations to achieve an effect of coefficient separation. Further, a control computer connected to an LED controller through a network sends the thermal compensation calibration coefficient matrix to a receiving card of the LED controller by using host computer software of the LED controller, so that coefficients in the thermal compensation calibration coefficient matrix are multiplied by coefficients in the point-by-point calibration coefficient matrix in a point-to-point manner to obtain a plurality of point-by-point thermal compensation calibration coefficients, so as to implement a point-by-point thermal compensation calibration function by using the point-by-point thermal compensation calibration coefficients.

Step 202: Calibrate the LED display screen box based on the calculated point-by-point thermal compensation calibration coefficient.

It can be learned from step 201 that the calculated point-by-point thermal compensation calibration coefficient is irrelevant to the module location of the LED display screen box, that is, does not change as the module location changes. Therefore, when the module location of the LED display screen box changes, the LED display screen box may also be calibrated based on the calculated point-by-point thermal compensation calibration coefficient, to implement the point-by-point thermal compensation calibration function. In addition, an original point-by-point calibration performed after a heat balance is reached is divided into two parts: a point-by-point calibration and a thermal compensation calibration, which are separately performed, and two calibration coefficients are saved. The separate thermal compensation calibration coefficient needs to be collected only once for the LED display screen box of a same structure and PCB layout, thereby greatly improving calibration efficiency.

Specifically, an LED display screen box calibration device may calibrate the LED display screen box by using different point-by-point thermal compensation calibration coefficients based on different temperatures of the LED display screen box. The thermal compensation calibration coefficient of the LED display screen box varies at different temperatures, and product results of different thermal compensation calibration coefficients and the point-by-point calibration coefficient also correspond to a plurality of different point-by-point thermal compensation calibration coefficients. Therefore, temperature monitoring of the LED display screen box may be associated with the point-by-point thermal compensation calibration coefficient. To be specific, several temperature thresholds, such as a first threshold and a second threshold, may be set. When it is detected that a temperature of the LED display screen box is less than the first threshold, the LED display screen box is calibrated by using a first point-by-point thermal compensation calibration coefficient. When it is detected that a temperature of the LED display screen box is greater than the second threshold, the LED display screen box is calibrated by using a second point-by-point thermal compensation calibration coefficient. When it is detected that a temperature of the LED display screen box is not less than the first threshold and not greater than the second threshold, the LED display screen box is calibrated by using a third point-by-point thermal compensation calibration coefficient. The first threshold and the second threshold are not fixed values, and may be set differently based on different application scenarios. For example, the first threshold may be set to 50° C., and the second threshold may be set to 70° C. Therefore, the temperature monitoring of the LED display screen box may be associated with a command corresponding to the point-by-point thermal compensation calibration coefficient by using the foregoing calibration method, to implement an automatic point-by-point thermal compensation calibration function of the LED display screen box.

Figure 3:
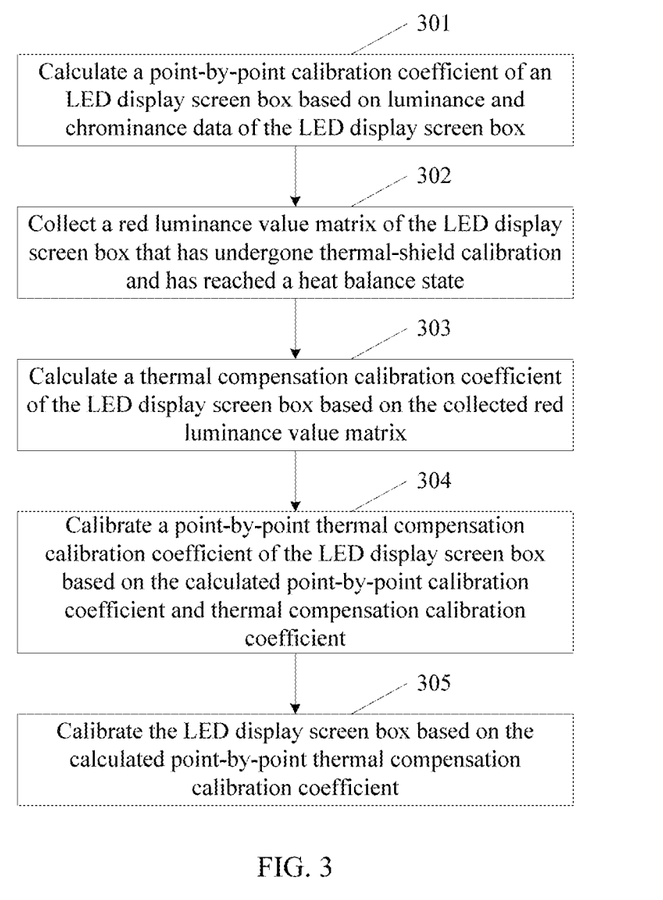
FIG. 3 is a schematic flowchart of another LED display screen calibration method according to an embodiment of this application.

FIG. 3 is a schematic flowchart of another LED display screen calibration method according to an embodiment of this application. The method includes but is not limited to the following steps.

Step 301: Calculate a point-by-point calibration coefficient of an LED display screen box based on luminance and chrominance data of the LED display screen box.

For example, an LED display screen box calibration device such as an LED control computer may collect luminance and chrominance data of the LED display screen box by using an external device such as a camera, and calculate a point-by-point calibration coefficient matrix based on the luminance and chrominance data. The point-by-point calibration coefficient matrix includes the point-by-point calibration coefficient. The point-by-point calibration coefficient is related to a module location of the LED display screen box. Optionally, an LED controller connected to the LED display screen box calibration device such as the LED control computer through a network may perform point-by-point calibration on the LED display screen box based on the calculated point-by-point calibration coefficient of the LED display screen box. The point-by-point calibration is a technology used to improve luminance uniformity and color uniformity and color fidelity of an LED display screen. To be specific, luminance (and chrominance) data of each pixel (or each primary color sub-pixel) region on the LED display screen is collected; a calibration coefficient for each primary color sub-pixel or a calibration coefficient matrix for each pixel is provided, and is fed back to a control system of the display screen; and the control system applies the calibration coefficient to implement differential driving for each pixel (or each primary color sub-pixel), so that an image of the LED display screen is pure and delicate, and a color is truly restored.

Step 302: Collect a red luminance value matrix of the LED display screen box that has undergone thermal-shield calibration and has reached a heat balance state.

In this step, thermal-shield calibration is performed on the LED display screen box. Specifically, the thermal-shield calibration is to perform point-by-point luminance and chrominance calibration on the LED display screen box within one minute after the LED display screen box is lit at room temperature. The room temperature herein is approximately 25° C. The LED display screen box that has undergone the thermal-shield calibration is used as a sample box. Optionally, for the point-by-point calibration coefficient, luminance and chrominance data of the sample box may also be collected at this time to calculate a point-by-point calibration coefficient matrix. Then the LED sample box performs display at 100% luminance and is subject to a white-light aging step for approximately 30 minutes, so that the LED sample box reaches a heat balance state. The heat balance state means that a heat distribution of the LED sample box no longer changes and a maximum temperature no longer changes, which indicates that the LED sample box has reached the heat balance state. Then a red luminance value matrix of the sample box that has undergone the thermal-shield calibration and has reached the heat distribution state is collected. The collected red luminance and chrominance value matrix may be used to calculate the thermal compensation calibration coefficient of the LED sample box.

Step 303: Calculate a thermal compensation calibration coefficient of the LED display screen box based on the collected red luminance value matrix.

The red luminance value matrix of the LED display screen box may be collected in step 302, and the red luminance and chrominance value matrix may be used to calculate the thermal compensation calibration coefficient of the LED sample box. Specifically, a result obtained by dividing a maximum value in the collected red luminance value matrix by the red luminance value matrix may be used as the thermal compensation calibration coefficient matrix. The thermal compensation calibration coefficient matrix includes a plurality of thermal compensation calibration coefficients, and the thermal compensation calibration coefficients obtained by using this method are related to the mechanical structure of the LED display screen box and are irrelevant to the module location of the LED display screen box. It should be noted that the obtained point-by-point calibration coefficient and thermal compensation calibration coefficient are separately stored in different locations. The point-by-point calibration coefficient and the thermal compensation calibration coefficient are stored separately, so that the thermal compensation calibration and the point-by-point calibration are performed as two different parts, thereby resolving a problem that the thermal compensation calibration cannot achieve an expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

Step 304: Calibrate a point-by-point thermal compensation calibration coefficient of the LED display screen box based on the calculated point-by-point calibration coefficient and thermal compensation calibration coefficient.

The point-by-point calibration coefficient and the thermal compensation calibration coefficient of the LED display screen box may be calculated in step 301 to step 303, and are separately stored in different locations to achieve an effect of coefficient separation. Further, the control computer connected to the LED controller through the network sends the thermal compensation calibration coefficient matrix to a receiving card of the LED controller by using host computer software of the LED controller, so that coefficients in the thermal compensation calibration coefficient matrix are multiplied by coefficients in the point-by-point calibration coefficient matrix in a point-to-point manner to obtain a plurality of point-by-point thermal compensation calibration coefficients, so as to implement a point-by-point thermal compensation calibration function by using the point-by-point thermal compensation calibration coefficients. The calculated point-by-point thermal compensation calibration coefficient is irrelevant to the module location of the LED display screen box, that is, does not change as the module location changes. Therefore, when the module location of the LED display screen box changes, the LED display screen box may also be calibrated based on the calculated point-by-point thermal compensation calibration coefficient, to implement the point-by-point thermal compensation calibration function. In addition, an original point-by-point calibration performed after a heat balance is reached is divided into two parts: a point-by-point calibration and a thermal compensation calibration, which are separately performed, and two calibration coefficients are saved. The separate thermal compensation calibration coefficient needs to be collected only once for the LED display screen box of a same structure and PCB layout, thereby greatly improving calibration efficiency.

Step 305: Calibrate the LED display screen box based on the calculated point-by-point thermal compensation calibration coefficient.

This step is the same as step 202.

The foregoing describes in detail the method in the embodiments of this application. The following provides an apparatus in the embodiments of this application.

Figure 4:
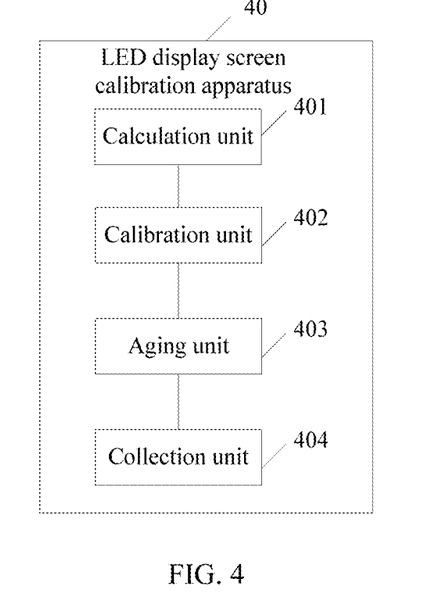
FIG. 4 is a schematic structural diagram of an LED display screen calibration apparatus according to an embodiment of this application.

FIG. 4 is a schematic structural diagram of an LED display screen calibration apparatus 40 according to an embodiment of this application. The LED display screen calibration apparatus may include a calculation unit 401, a calibration unit 402, an aging unit 403, and a collection unit 404. The units are described as follows:

The calculation unit 401 is configured to calculate a point-by-point thermal compensation calibration coefficient based on a thermal compensation calibration coefficient and a point-by-point calibration coefficient of an LED display screen box. The thermal compensation calibration coefficient is related to a mechanical structure of the LED display screen box and is irrelevant to a module location of the LED display screen box. The point-by-point calibration coefficient is related to the module location of the LED display screen box. The point-by-point thermal compensation calibration coefficient is related to the mechanical structure of the LED display screen box and is irrelevant to the module location of the LED display screen box.

The calibration unit 402 is configured to calibrate the LED display screen box based on the point-by-point thermal compensation calibration coefficient.

In this embodiment of this application, a thermal compensation calibration coefficient used in an original calibration method is included in a point-by-point calibration coefficient, and the point-by-point calibration coefficient is related to the module location of the LED display screen box. Therefore, the thermal compensation calibration coefficient is also related to the module location of the LED display screen box. To be specific, when the module location of the LED display screen box changes, the thermal compensation calibration coefficient is affected by the change of the location of the module, and therefore a thermal compensation calibration cannot achieve an expected effect. In this embodiment of this application, an original point-by-point calibration performed after a heat balance is reached is divided into two parts: a point-by-point calibration and a thermal compensation calibration, which are separately performed, and two calibration coefficients are saved, thereby resolving a problem that the thermal compensation calibration cannot achieve an expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

In a possible implementation, the calculation unit 401 is specifically configured to multiply the thermal compensation calibration coefficient by the point-by-point calibration coefficient to obtain the point-by-point thermal compensation calibration coefficient.

In this embodiment of this application, the thermal compensation calibration and the point-by-point calibration are performed as two different parts, and the coefficients of the two calibrations are separated. The point-by-point thermal compensation calibration coefficient obtained by calculating a product of the thermal compensation calibration coefficient and the point-by-point calibration coefficient is related only to the mechanical structure of the LED display screen box and is irrelevant to the module location of the LED display screen box, so that an effect of separate calibrations can be achieved, and the thermal compensation calibration is still effective even if the module location of the LED display screen box changes.

In another possible implementation, the calibration unit 402 is specifically configured to calibrate the LED display screen box based on the point-by-point thermal compensation calibration coefficient when the module location of the LED display screen box changes.

In this embodiment of this application, the calculated point-by-point thermal compensation calibration coefficient is related only to the mechanical structure of the LED display screen box and is irrelevant to the module location of the LED display screen box, so that the thermal compensation calibration is still effective even if the module location of the LED display screen box changes.

In another possible implementation, the calibration unit 402 is specifically further configured to: if a temperature of the LED display screen box is less than a first threshold, calibrate the LED display screen box by using a first point-by-point thermal compensation calibration coefficient; if a temperature of the LED display screen box is greater than a second threshold, calibrate the LED display screen box by using a second point-by-point thermal compensation calibration coefficient; or if a temperature of the LED display screen box is not less than the first threshold and not greater than the second threshold, calibrate the LED display screen box by using a third point-by-point thermal compensation calibration coefficient, where the first point-by-point thermal compensation calibration coefficient, the second point-by-point thermal compensation calibration coefficient, and the third point-by-point thermal compensation calibration coefficient are different values of the point-by-point thermal compensation calibration coefficient.

In this embodiment of this application, the LED display screen box is calibrated by using different point-by-point thermal compensation calibration coefficients based on different temperatures of the LED display screen box. The thermal compensation calibration coefficient of the LED display screen box varies at different temperatures, and product results of different thermal compensation calibration coefficients and the point-by-point calibration coefficient also correspond to a plurality of different point-by-point thermal compensation calibration coefficients. Therefore, temperature monitoring of the LED display screen box may be associated with the point-by-point thermal compensation calibration coefficient. To be specific, several temperature thresholds, such as a first threshold and a second threshold, may be set. When it is detected that a temperature of the LED display screen box is less than the first threshold, the LED display screen box is calibrated by using a first point-by-point thermal compensation calibration coefficient. When it is detected that a temperature of the LED display screen box is greater than the second threshold, the LED display screen box is calibrated by using a second point-by-point thermal compensation calibration coefficient. When it is detected that a temperature of the LED display screen box is not less than the first threshold and not greater than the second threshold, the LED display screen box is calibrated by using a third point-by-point thermal compensation calibration coefficient. Therefore, an automatic point-by-point thermal compensation calibration function of the LED display screen box can be implemented by using the foregoing calibration method.

In another possible implementation, the calibration unit 402 is further configured to perform thermal-shield calibration on the LED display screen box to obtain a sample box, where the sample box is the LED display screen box that has undergone the thermal-shield calibration.

The aging unit 403 is configured to perform white-light aging treatment on the sample box until the sample box reaches a heat balance state, where the heat balance state means that a heat distribution and a maximum temperature of the sample box no longer change.

The collection unit 404 is configured to collect a red luminance value matrix of the sample box in the heat balance state.

The calculation unit 401 is further configured to calculate a thermal compensation calibration coefficient matrix of the LED display screen box based on the red luminance value matrix. The thermal compensation calibration coefficient matrix includes the thermal compensation calibration coefficient.

In this embodiment of this application, a method for obtaining the thermal compensation calibration coefficient is provided. Thermal-shield calibration is performed on the LED display screen box, and then white-light aging treatment is performed, until the heat distribution and the maximum temperature of the LED display screen box no longer change. Then the red luminance value matrix of the LED display screen box is collected, and the thermal compensation calibration coefficient is calculated based on the collected red luminance value matrix. The thermal compensation calibration coefficient obtained by using this method is related to the mechanical structure of the LED display screen box and is irrelevant to the module location of the LED display screen box.

In another possible implementation, the calculation unit 401 is further configured to divide a maximum value in the red luminance value matrix by the red luminance value matrix to obtain the thermal compensation calibration coefficient matrix of the LED display screen box.

In this embodiment of this application, a method for calculating the thermal compensation calibration coefficient matrix is provided. The maximum value in the collected red luminance value matrix of the sample box is divided by the red luminance value matrix to obtain the thermal compensation calibration coefficient matrix. The thermal compensation calibration coefficient matrix includes thermal compensation calibration coefficients of the LED display screen box at different temperatures.

In another possible implementation, the collection unit 404 is further configured to collect luminance and chrominance data of the LED display screen box.

The calculation unit 401 is further configured to calculate a point-by-point calibration coefficient matrix of the LED display screen box based on the luminance and chrominance data of the LED display screen box. The point-by-point calibration coefficient matrix includes the point-by-point calibration coefficient.

In this embodiment of this application, a method for obtaining the point-by-point calibration coefficient is provided. The luminance and chrominance data of the LED display screen box is collected, and the point-by-point calibration coefficient matrix is calculated based on the luminance and chrominance data. The point-by-point calibration coefficient matrix includes the point-by-point calibration coefficient. The point-by-point calibration coefficient is related to the module location of the LED display screen box.

In another possible implementation, the point-by-point calibration coefficient and the thermal compensation calibration coefficient are stored in different locations.

In this embodiment of this application, the point-by-point calibration coefficient and the thermal compensation calibration coefficient are stored separately, so that the thermal compensation calibration and the point-by-point calibration are performed as two different parts, thereby resolving a problem that the thermal compensation calibration cannot achieve an expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

According to this embodiment of this application, the units in the apparatus shown in FIG. 4 may be separately or all combined into one or several other units, or some of the units may be further split into a plurality of units with smaller functionalities. This can implement same operations without affecting implementation of the technical effects of this embodiment of this application. The units are divided based on logical functions. In actual application, a function of one unit may be alternatively implemented by a plurality of units, or functions of a plurality of units are implemented by one unit. In other embodiments of this application, other units may also be included based on a terminal. In actual application, the functions may be alternatively implemented with assistance of other units, and may be implemented by a plurality of units in cooperation.

It should be noted, for implementations of the units, reference may be further made to the corresponding descriptions of the method embodiments shown in FIG. 2 and FIG. 3.

In the LED display screen calibration apparatus described in FIG. 4, an original point-by-point calibration performed after a heat balance is reached is divided into two parts: a point-by-point calibration and a thermal compensation calibration, which are separately performed, and two calibration coefficients are saved, thereby resolving a problem that the thermal compensation calibration cannot achieve an expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

Figure 5:
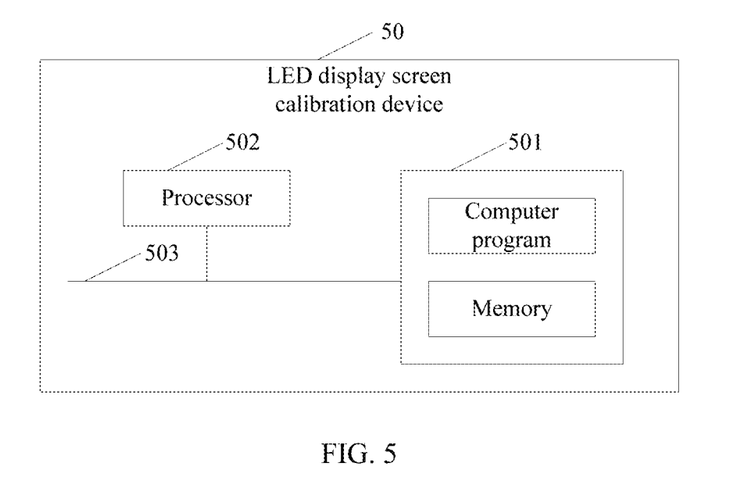
FIG. 5 is a schematic structural diagram of an LED display screen calibration device according to an embodiment of this application.

FIG. 5 is a schematic structural diagram of an LED display screen calibration device 50 according to an embodiment of this application. The LED display screen calibration device 50 may include a memory 501 and a processor 502. Further, optionally, a bus 503 may be included, and the memory 501 and the processor 502 are connected through the bus 503.

The memory 501 is configured to provide storage space, and the storage space may store data such as an operating system and a computer program. The memory 501 includes but is not limited to a random access memory (random access memory, RAM), a read-only memory (read-only memory, ROM), an erasable programmable read only memory (erasable programmable read only memory, EPROM), or a compact disc read-only memory (compact disc read-only memory, CD-ROM).

The processor 502 is a module for performing an arithmetic operation and a logical operation, and may be one or a combination of the following processing modules: a central processing unit (central processing unit, CPU), a graphics processing unit (graphics processing unit, GPU), or a microprocessor unit (microprocessor unit, MPU).

The memory 501 stores a computer program. The processor 502 invokes the computer program stored in the memory 501 to perform the following operations:

calculating a point-by-point thermal compensation calibration coefficient based on a thermal compensation calibration coefficient and a point-by-point calibration coefficient of an LED display screen box, where the thermal compensation calibration coefficient is related to a mechanical structure of the LED display screen box and is irrelevant to a module location of the LED display screen box, the point-by-point calibration coefficient is related to the module location of the LED display screen box, and the point-by-point thermal compensation calibration coefficient is related to the mechanical structure of the LED display screen box and is irrelevant to the module location of the LED display screen box; and calibrating the LED display screen box based on the point-by-point thermal compensation calibration coefficient.

In this embodiment of this application, a thermal compensation calibration coefficient used in an original calibration method is included in a point-by-point calibration coefficient, and the point-by-point calibration coefficient is related to the module location of the LED display screen box. Therefore, the thermal compensation calibration coefficient is also related to the module location of the LED display screen box. To be specific, when the module location of the LED display screen box changes, the thermal compensation calibration coefficient is affected by the change of the location of the module, and therefore a thermal compensation calibration cannot achieve an expected effect. In this embodiment of this application, an original point-by-point calibration performed after a heat balance is reached is divided into two parts: a point-by-point calibration and a thermal compensation calibration, which are separately performed, and two calibration coefficients are saved, thereby resolving a problem that the thermal compensation calibration cannot achieve an expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

In a possible implementation, in terms of calculating the point-by-point thermal compensation calibration coefficient based on the thermal compensation calibration coefficient and the point-by-point calibration coefficient of the LED display screen box, the processor 502 is specifically configured to multiply the thermal compensation calibration coefficient by the point-by-point calibration coefficient to obtain the point-by-point thermal compensation calibration coefficient.

In a possible implementation, in terms of calibrating the LED display screen box based on the point-by-point thermal compensation calibration coefficient, the processor 502 is specifically configured to calibrate the LED display screen box based on the point-by-point thermal compensation calibration coefficient when the location of the module of the LED display screen box changes.

In a possible implementation, in terms of calibrating the LED display screen box based on the point-by-point thermal compensation calibration coefficient, the processor 502 is specifically configured to: if a temperature of the LED display screen box is less than a first threshold, calibrate the LED display screen box by using a first point-by-point thermal compensation calibration coefficient; if a temperature of the LED display screen box is greater than a second threshold, calibrate the LED display screen box by using a second point-by-point thermal compensation calibration coefficient; or if a temperature of the LED display screen box is not less than the first threshold and not greater than the second threshold, calibrate the LED display screen box by using a third point-by-point thermal compensation calibration coefficient. The first point-by-point thermal compensation calibration coefficient, the second point-by-point thermal compensation calibration coefficient, and the third point-by-point thermal compensation calibration coefficient are different values of the point-by-point thermal compensation calibration coefficient.

In a possible implementation, before calculating the point-by-point thermal compensation calibration coefficient, the processor 502 is specifically further configured to: perform thermal-shield calibration on the LED display screen box to obtain a sample box, where the sample box is the LED display screen box that has undergone the thermal-shield calibration; perform white-light aging treatment on the sample box until the sample box reaches a heat balance state, where the heat balance state means that a heat distribution and a maximum temperature of the sample box no longer change; collect a red luminance value matrix of the sample box in the heat balance state; and calculate a thermal compensation calibration coefficient matrix of the LED display screen box based on the red luminance value matrix, where the thermal compensation calibration coefficient matrix includes the thermal compensation calibration coefficient.

In a possible implementation, in terms of calculating the thermal compensation calibration coefficient matrix of the LED display screen box based on the red luminance value matrix, the processor 502 is specifically configured to divide a maximum value in the red luminance value matrix by the red luminance value matrix to obtain the thermal compensation calibration coefficient matrix of the LED display screen box.

In a possible implementation, before calculating the point-by-point thermal compensation calibration coefficient, the processor 502 is specifically configured to: collect luminance and chrominance data of the LED display screen box; and calculate a point-by-point calibration coefficient matrix of the LED display screen box based on the luminance and chrominance data of the LED display screen box, where the point-by-point calibration coefficient matrix includes the point-by-point calibration coefficient.

In a possible implementation, the point-by-point calibration coefficient and the thermal compensation calibration coefficient are stored in different locations. It should be noted, for specific implementations of the LED display screen calibration device, reference may be further made to the corresponding descriptions of the method embodiments shown in FIG. 2 and FIG. 3.

In the LED display screen calibration device 50 described in FIG. 5, an original point-by-point calibration performed after a heat balance is reached is divided into two parts: a point-by-point calibration and a thermal compensation calibration, which are separately performed, and two calibration coefficients are saved, thereby resolving a problem that the thermal compensation calibration cannot achieve an expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

An embodiment of this application further provides a computer-readable storage medium. The computer-readable storage medium stores a computer program. When the computer program is run on one or more processors, the LED display screen calibration method shown in FIG. 2 and FIG. 3 may be implemented.

An embodiment of this application further provides a computer program product. When the computer program product is run on a computer, the LED display screen calibration method shown in FIG. 2 and FIG. 3 may be implemented.

To sum up, by implementing the embodiments of this application, an original point-by-point calibration performed after a heat balance is reached is divided into two parts: a point-by-point calibration and a thermal compensation calibration, which are separately performed, and two calibration coefficients are saved, thereby resolving a problem that the thermal compensation calibration cannot achieve an expected effect because the module location of the LED display screen box changes after the thermal compensation calibration. In addition, the separate thermal compensation calibration coefficient needs to be collected only once for the LED display screen box of a same structure and PCB layout, thereby greatly improving calibration efficiency.

A person of ordinary skill in the art can understand that all or some of the processes in the foregoing method embodiments may be performed by hardware related to a computer program. The computer program may be stored in a computer-readable storage medium. When the computer program is executed, the processes in the foregoing method embodiments may be included. The storage medium includes any medium that can store computer program code, for example, a read-only memory ROM, a random access memory RAM, a magnetic disk, or an optical disc.

What is claimed is:

1. A light emitting diode (LED) display screen calibration method, comprising:
    calculating a point-by-point thermal compensation calibration coefficient based on a thermal compensation calibration coefficient and a point-by-point calibration coefficient of an LED display screen box, wherein the thermal compensation calibration coefficient is related to a mechanical structure of the LED display screen box and is irrelevant to a module location of the LED display screen box, the point-by-point calibration coefficient is related to the module location of the LED display screen box, and the point-by-point thermal compensation calibration coefficient is related to the mechanical structure of the LED display screen box and is irrelevant to the module location of the LED display screen box; and
    calibrating the LED display screen box based on the point-by-point thermal compensation calibration coefficient,
    wherein before the calculating a point-by-point thermal compensation calibration coefficient, the method further comprises:
        performing thermal-shield calibration on the LED display screen box to obtain a sample box, wherein the sample box is the LED display screen box that has undergone the thermal-shield calibration;
        performing white-light aging treatment on the sample box until the sample box reaches a heat balance state, wherein the heat balance state means that a heat distribution and a maximum temperature of the sample box no longer change;
        collecting a red luminance value matrix of the sample box in the heat balance state; and
        calculating a thermal compensation calibration coefficient matrix of the LED display screen box based on the red luminance value matrix, wherein the thermal compensation calibration coefficient matrix comprises the thermal compensation calibration coefficient.

2. The method according to claim 1, wherein the calculating a point-by-point thermal compensation calibration coefficient based on a thermal compensation calibration coefficient and a point-by-point calibration coefficient of an LED display screen box comprises:
    multiplying the thermal compensation calibration coefficient by the point-by-point calibration coefficient to obtain the point-by-point thermal compensation calibration coefficient.

3. The method according to claim 1, wherein the calibrating the LED display screen box based on the point-by-point thermal compensation calibration coefficient comprises:
    calibrating the LED display screen box based on the point-by-point thermal compensation calibration coefficient when the module location of the LED display screen box changes.

4. The method according to claim 3, wherein the calibrating the LED display screen box based on the point-by-point thermal compensation calibration coefficient comprises:
    if a temperature of the LED display screen box is less than a first threshold, calibrating the LED display screen box by using a first point-by-point thermal compensation calibration coefficient;
    if the temperature of the LED display screen box is greater than a second threshold, calibrating the LED display screen box by using a second point-by-point thermal compensation calibration coefficient; or
    if the temperature of the LED display screen box is not less than the first threshold and not greater than the second threshold, calibrating the LED display screen box by using a third point-by-point thermal compensation calibration coefficient, wherein
    the first point-by-point thermal compensation calibration coefficient, the second point-by-point thermal compensation calibration coefficient, and the third point-by-point thermal compensation calibration coefficient are different values of the point-by-point thermal compensation calibration coefficient.

5. The method according to claim 1, wherein the calculating a thermal compensation calibration coefficient matrix of the LED display screen box based on the red luminance value matrix comprises:
    dividing a maximum value in the red luminance value matrix by the red luminance value matrix to obtain the thermal compensation calibration coefficient matrix of the LED display screen box.

6. The method according to claim 1, wherein before the calculating a point-by-point thermal compensation calibration coefficient, the method further comprises:
    collecting luminance and chrominance data of the LED display screen box; and
    calculating a point-by-point calibration coefficient matrix of the LED display screen box based on the luminance and chrominance data of the LED display screen box, wherein the point-by-point calibration coefficient matrix comprises the point-by-point calibration coefficient.

7. The method according to claim 1, wherein the point-by-point calibration coefficient and the thermal compensation calibration coefficient are stored in different locations.

8. An electronic device, comprising:
    a processor; and
    a non-transitory memory, coupled to the processor and storing program instructions thereon which, when executed by the processor, cause the processor to:
        calculate a point-by-point thermal compensation calibration coefficient based on a thermal compensation calibration coefficient and a point-by-point calibration coefficient of an LED display screen box of the electronic device, wherein the thermal compensation calibration coefficient is related to a mechanical structure of the LED display screen box and is irrelevant to a module location of the LED display screen box, the point-by-point calibration coefficient is related to the module location of the LED display screen box, and the point-by-point thermal compensation calibration coefficient is related to the mechanical structure of the LED display screen box and is irrelevant to the module location of the LED display screen box; and calibrate the LED display screen box based on the point-by-point thermal compensation calibration coefficient;

wherein the processor is further configured to:

before the calculating a point-by-point thermal compensation calibration coefficient, perform thermal-shield calibration on the LED display screen box to obtain a sample box, wherein the sample box is the LED display screen box that has undergone the thermal-shield calibration;

perform white-light aging treatment on the sample box until the sample box reaches a heat balance state, wherein the heat balance state means that a heat distribution and a maximum temperature of the sample box no longer change;

collect a red luminance value matrix of the sample box in the heat balance state; and calculate a thermal compensation calibration coefficient matrix of the LED display screen box based on the red luminance value matrix, wherein the thermal compensation calibration coefficient matrix comprises the thermal compensation calibration coefficient.

9. The electronic device according to claim 8, wherein the processor configured to calculate a point-by-point thermal compensation calibration coefficient based on a thermal compensation calibration coefficient and a point-by-point calibration coefficient of an LED display screen box is configured to:

multiply the thermal compensation calibration coefficient by the point-by-point calibration coefficient to obtain the point-by-point thermal compensation calibration coefficient.

10. The electronic device according to claim 8, wherein the processor configured to calibrate the LED display screen box based on the point-by-point thermal compensation calibration coefficient is configured to:

calibrate the LED display screen box based on the point-by-point thermal compensation calibration coefficient when the module location of the LED display screen box changes.

11. The electronic device according to claim 10, wherein the processor configured to calibrate the LED display screen box based on the point-by-point thermal compensation calibration coefficient is configured to:

if a temperature of the LED display screen box is less than a first threshold, calibrate the LED display screen box by using a first point-by-point thermal compensation calibration coefficient;

if the temperature of the LED display screen box is greater than a second threshold, calibrate the LED display screen box by using a second point-by-point thermal compensation calibration coefficient; or if the temperature of the LED display screen box is not less than the first threshold and not greater than the second threshold, calibrate the LED display screen box by using a third point-by-point thermal compensation calibration coefficient, wherein the first point-by-point thermal compensation calibration coefficient, the second point-by-point thermal compensation calibration coefficient, and the third point-by-point thermal compensation calibration coefficient are different values of the point-by-point thermal compensation calibration coefficient.

12. The electronic device according to claim 8, wherein the processor configured to calculate a thermal compensation calibration coefficient matrix of the LED display screen box based on the red luminance value matrix is configured to:

divide a maximum value in the red luminance value matrix by the red luminance value matrix to obtain the thermal compensation calibration coefficient matrix of the LED display screen box.

13. The electronic device according to claim 8, wherein the processor is further configured to:

before the calculating a point-by-point thermal compensation calibration coefficient, collect luminance and chrominance data of the LED display screen box; and calculate a point-by-point calibration coefficient matrix of the LED display screen box based on the luminance and chrominance data of the LED display screen box, wherein the point-by-point calibration coefficient matrix comprises the point-by-point calibration coefficient.

14. The electronic device according to claim 8, wherein the point-by-point calibration coefficient and the thermal compensation calibration coefficient are stored in different locations.

15. A non-transitory computer-readable storage medium, storing a computer program which, when executed by a processor of an electronic device, causes the processor to carry out actions, comprising:

calculating a point-by-point thermal compensation calibration coefficient based on a thermal compensation calibration coefficient and a point-by-point calibration coefficient of an LED display screen box of the electronic device, wherein the thermal compensation calibration coefficient is related to a mechanical structure of the LED display screen box and is irrelevant to a module location of the LED display screen box, the point-by-point calibration coefficient is related to the module location of the LED display screen box, and the point-by-point thermal compensation calibration coefficient is related to the mechanical structure of the LED display screen box and is irrelevant to the module location of the LED display screen box; and calibrating the LED display screen box based on the point-by-point thermal compensation calibration coefficient;

wherein the computer program is further executed by the processor to carry out actions, comprising:

before the calculating a point-by-point thermal compensation calibration coefficient, performing thermal-shield calibration on the LED display screen box to obtain a sample box, wherein the sample box is the LED display screen box that has undergone the thermal-shield calibration;

performing white-light aging treatment on the sample box until the sample box reaches a heat balance state, wherein the heat balance state means that a heat distribution and a maximum temperature of the sample box no longer change;

collecting a red luminance value matrix of the sample box in the heat balance state; and calculating a thermal compensation calibration coefficient matrix of the LED display screen box based on the red luminance value matrix, wherein the thermal compensation calibration coefficient matrix comprises the thermal compensation calibration coefficient.

16. The non-transitory computer-readable storage medium according to claim 15, wherein the computer program executed by the processor to carry out the action of calculating a point-by-point thermal compensation calibration coefficient based on a thermal compensation calibration coefficient and a point-by-point calibration coefficient of an LED display screen box is executed by the processor to carry out actions, comprising:
   multiplying the thermal compensation calibration coefficient by the point-by-point calibration coefficient to obtain the point-by-point thermal compensation calibration coefficient.

17. The non-transitory computer-readable storage medium according to claim 15, wherein the computer program executed by the processor to carry out the action of calibrating the LED display screen box based on the point-by-point thermal compensation calibration coefficient is executed by the processor to carry out actions, comprising:
   calibrating the LED display screen box based on the point-by-point thermal compensation calibration coefficient when the module location of the LED display screen box changes.

18. The non-transitory computer-readable storage medium according to claim 17, wherein the computer program executed by the processor to carry out the action of the calibrating the LED display screen box based on the point-by-point thermal compensation calibration coefficient is executed by the processor to carry out actions, comprising:
   if a temperature of the LED display screen box is less than a first threshold, calibrating the LED display screen box by using a first point-by-point thermal compensation calibration coefficient;
   if the temperature of the LED display screen box is greater than a second threshold, calibrating the LED display screen box by using a second point-by-point thermal compensation calibration coefficient; or
   if the temperature of the LED display screen box is not less than the first threshold and not greater than the second threshold, calibrating the LED display screen box by using a third point-by-point thermal compensation calibration coefficient, wherein
   the first point-by-point thermal compensation calibration coefficient, the second point-by-point thermal compensation calibration coefficient, and the third point-by-point thermal compensation calibration coefficient are different values of the point-by-point thermal compensation calibration coefficient.

19. The non-transitory computer-readable storage medium according to claim 15, wherein the computer program executed by the processor to carry out the action of the calculating a thermal compensation calibration coefficient matrix of the LED display screen box based on the red luminance value matrix is executed by the processor to carry out actions, comprising:
   dividing a maximum value in the red luminance value matrix by the red luminance value matrix to obtain the thermal compensation calibration coefficient matrix of the LED display screen box.

20. The non-transitory computer-readable storage medium according to claim 15, wherein before the calculating a point-by-point thermal compensation calibration coefficient, the computer program is further executed by the processor to carry out the action of, comprising:
   collecting luminance and chrominance data of the LED display screen box; and
   calculating a point-by-point calibration coefficient matrix of the LED display screen box based on the luminance and chrominance data of the LED display screen box, wherein the point-by-point calibration coefficient matrix comprises the point-by-point calibration coefficient.

* * * * *